United States Patent
He et al.

(10) Patent No.: US 7,170,796 B1
(45) Date of Patent: Jan. 30, 2007

(54) METHODS AND SYSTEMS FOR REDUCING THE THRESHOLD VOLTAGE DISTRIBUTION FOLLOWING A MEMORY CELL ERASE

(75) Inventors: Yi He, Fremont, CA (US); Gwyn Jones, Sunnyvale, CA (US); Edward F. Runnion, Santa Clara, CA (US); Mark Randolph, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/193,391

(22) Filed: Aug. 1, 2005

(51) Int. Cl.
*G11C 11/34* (2006.01)

(52) U.S. Cl. .......................... 365/185.29; 365/185.22; 365/185.18

(58) Field of Classification Search ........... 365/185.29, 365/185.22, 185.18, 185.28
See application file for complete search history.

(56) References Cited

U.S. PATENT DOCUMENTS

| | | | |
|---|---|---|---|
| 6,172,909 B1 | 1/2001 | Haddad et al. | 365/185.19 |
| 6,208,560 B1 * | 3/2001 | Tanaka et al. | 365/185.22 |
| 6,252,803 B1 * | 6/2001 | Fastow et al. | 365/185.22 |
| 6,381,177 B1 * | 4/2002 | De Sandre et al. | 365/185.19 |
| 6,483,752 B1 * | 11/2002 | Hirano | 365/185.33 |
| 6,493,266 B1 * | 12/2002 | Yachareni et al. | 365/185.22 |

* cited by examiner

*Primary Examiner*—Anh Phung
(74) *Attorney, Agent, or Firm*—Harrity Snyder, L.L.P.

(57) ABSTRACT

A method is provided for erasing a memory device including a number of memory cells, the memory cells including a substrate, a control gate, a charge storage element, a source region and a drain region. The method includes erasing a group of memory cells to lower a maximum threshold voltage of the group of memory cells below a first predetermined level. The group of memory cells is soft-programmed to raise a minimum threshold voltage of the group of memory cells above a second predetermined level. The group of memory cells is erased, following soft-programming, resulting in a reduced threshold voltage distribution associated with the group of memory cells.

20 Claims, 4 Drawing Sheets

METHODS AND SYSTEMS FOR REDUCING THE THRESHOLD VOLTAGE DISTRIBUTION FOLLOWING A MEMORY CELL ERASE

TECHNICAL FIELD

The present invention relates generally to memory devices. The present invention has particular applicability to non-volatile flash memory cells in electrically erasable and programmable memory devices.

BACKGROUND ART

A flash or block erase Electrically Erasable Programmable Read-Only Memory (Flash EEPROM) device includes an array of cells that can be independently programmed and read. As a result, a group of the cells must be erased together as a block. A flash memory device of this type includes individual Metal-Oxide-Semiconductor Field Effect Transistor (MOSFET) memory cells, each of which includes a source, a drain, a charge storage layer and a control gate to which various voltages are applied to thereby program the cell with a binary 1 or 0, to read the cell, to erase all or some of the cells as a block, to verify that the cell is erased or to verify that the cell is not over-erased.

Memory cells in a flash memory device are typically connected in an array of rows and columns, with the control gates of the cells in a row being connected to a respective word line and the drains of the cells in a column being connected to a respective bit line. The sources of all the cells in a column are connected to another bit line.

A cell is typically programmed by applying a voltage to the control gate, applying a voltage to the drain and grounding the source. A cell is typically read by applying a voltage to the word line to which the control gate of the cell is connected, applying a voltage to the bit line to which the drain of the cell is connected, grounding the source, and sensing the bit line current. If the cell is programmed and the threshold voltage is relatively high, the bit line current will be zero or nearly zero. If the cell is not programmed or erased, the threshold voltage will be relatively low, the control gate voltage will invert the channel, and the bit line current will be relatively high.

A cell can be erased in several ways. In one arrangement, a cell is erased by applying a voltage to the P-well (substrate) and a negative voltage to the control gate, while allowing the source/drain to float. In another arrangement, a cell may be erased by applying a relatively high voltage to the source (or drain), a negative voltage to the control gate and allowing the drain (or source) to float. These applied voltages cause the electrons that were injected into the charge trapping layer during programming to undergo either Fowler-Nordheim tunneling or hot hole neutralization through the thin tunnel oxide layer to either the substrate (P-well) or the source/drain depending on the type of erase being performed.

More specifically, during program and read operations only one word line connected to the control gates of a row of cells is held high at a time, while the other word lines are grounded. A positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory cells, for example 512 cells are connected to each bit line. If a substantial number of cells on the bit line are drawing background leakage current, the total leakage current on the bit line can exceed the cell read current. This makes it impossible to read the state of any cell on the bit line and therefore renders the memory inoperative.

Because the background leakage current of a cell varies as a function of threshold voltage, the lower (more negative) the threshold voltage, the higher the leakage current. It is therefore desirable to prevent cells from being over-erased by reducing the threshold voltage distribution to as low a range as possible, with ideally all cells having the same threshold voltage after erase.

DISCLOSURE OF THE INVENTION

Advantages and features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one implementation consistent with principles of the invention, a method is provided for erasing a memory device including a number of memory cells, the memory cells including a substrate, a control gate, a charge storage element, a source region and a drain region. The method includes erasing a first group of memory cells to lower a maximum threshold voltage of the first group of memory cells below a first predetermined level. The first group of memory cells is soft-programmed to raise a minimum threshold voltage of the first group of memory cells above a second predetermined level. The first group of memory cells is erased, following soft-programming, resulting in a reduced threshold voltage distribution associated with the first group of memory cells.

According to another aspect of the invention, a memory device is provided including an array of memory cells, the memory cells each having a substrate, a control gate, a charge storage layer, a source region, and a drain region. The memory device further includes: means for applying an erase pulse to at least some of the memory cells to lower a maximum threshold voltage of the at least some of the memory cells below a first predetermined level; means for applying a soft-program pulse to the at least some of the memory cells to raise a minimum threshold voltage of the at least some of the memory cells above a second predetermined level; and means for applying at least one additional erase pulse to the at least some of the memory cells, following application of the soft-program pulse, to generate a reduced threshold voltage distribution, associated with the at least some of the memory cells.

According to yet another aspect of the invention, a method is provided for reducing a threshold voltage distribution in a memory device having an array of memory cells, each memory cell including a substrate, a control gate, a charge storage layer, a source region, and a drain region. The method includes: applying at least one erase pulse to a number of memory cells in the array of memory cells; applying at least one soft-program pulse to the number of memory cells; and applying at least one additional erase pulse to the number of memory cells, where the additional erase pulse results in a reduced threshold voltage distribution associated with the number of memory cells substantially narrower than the threshold voltage distribution associated with the number of memory cells prior to application of the soft-program pulse.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a method for erasing non-volatile memory devices, such as flash EEPROM devices. The method includes erasing a first group of memory cells in the device to lower a maximum threshold voltage of the memory device to a first predetermined level. Following initial erasure, the memory cells may be soft-programmed to correct over-erase conditions. Following soft-programming, at least one additional erase process may be carried out to reduce the resulting threshold voltage distribution of the memory cells in the device.

Figure 1:
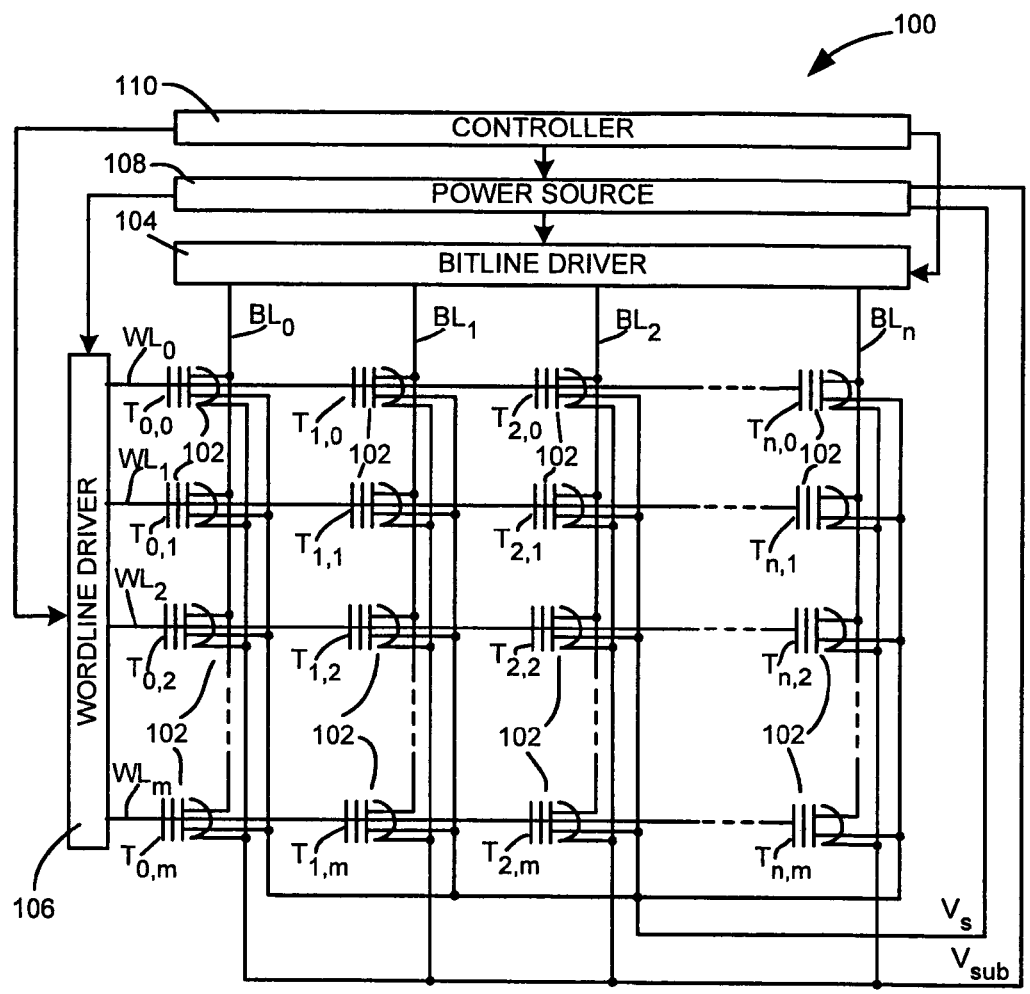
FIG. 1 is a simplified electrical schematic diagram of a programmable flash EEPROM device.

FIG. 1 illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bit lines (BL) associated with each column, a plurality of word lines associated with each row, a bit line driver 104, a word line driver 106, a power source 108 and a controller 110.

Assuming that there are n columns and m rows, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. The controller 110 may also control the drivers 104 and 106 to address memory cells 102 individually or collectively as will be described below.

A memory cell 102 is located at each junction of a word line and a bit line. Each cell 102 includes a Metal-Oxide-Semiconductor (MOS) Field Effect Transistor (FET) having a source and drain formed in a semiconductor substrate, a charge trapping layer, and a control gate separated from the charge trapping layer by, for example, a layer of oxide. Additional details regarding the formation of cell 102 will be described below in relation to FIG. 2. As should be appreciated, the cells of a flash EEPROM differ from conventional FETs in that they include the charge trapping layer and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells 102 are connected to the power source 106.

Figure 2:
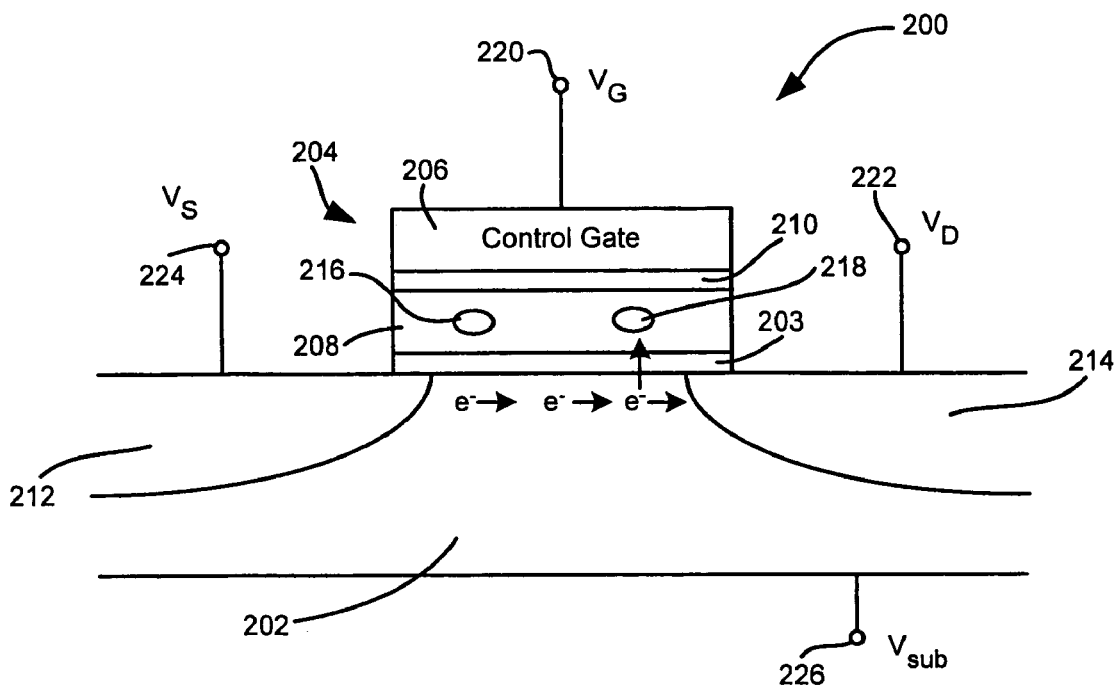
FIG. 2 is a schematic cross-section of an exemplary flash memory cell 100 formed in accordance with an embodiment of the present invention.

FIG. 2 illustrates a schematic cross-section of an exemplary flash memory cell 200 formed in accordance with an embodiment of the present invention. Referring to FIG. 2, memory cell 200 may include a silicon substrate 202, an oxide layer 203 and a stacked gate structure 204 including a control gate 206 and a charge storage layer 208 separated by an intergate dielectric layer 210.

In one embodiment, silicon substrate 202 may include a p-type substrate. In another embodiment, silicon substrate 202 may include an n-type substrate. Memory cell 200 may include a pair of doped regions 212 and 214 formed in silicon substrate 202. Doped regions 212 and 214 may include $n^+$ type doped regions for a p-type substrate 202. Doped region 212 may function as a source region and doped region 214 may function as a drain region for memory cell 200. Dielectric layer 210 may include, for example, silicon dioxide. In one implementation, oxide layer 203 may be referred to as a tunnel oxide layer.

As illustrated in FIG. 2, charge storage layer 208 of memory cell 200 may include multiple charge storage regions. Two charge storage regions 216 and 218 are illustrated for explanatory purposes. A first charge storage region (also called a "first bit") 216 may be formed in the side of charge storage layer 208 near drain region 214 (e.g., the right side illustrated in FIG. 2) and a second charge storage region (also called a "second bit") 218 may be formed in the side of charge storage layer 208 near source region 212 (e.g., the left side illustrated in FIG. 2).

When memory cell 200 is undergoing an erase in accordance with one implementation consistent with the present invention, a voltage $V_G$ may be applied to the control gate 206 via a terminal 220, a voltage $V_D$ may be applied to drain region 214 via the terminal 222, and a voltage $V_S$ may be applied to source region 212 via terminal 224. A voltage $V_{sub}$ may be applied to the substrate or p-well 202 via terminal 226.

Figure 3:
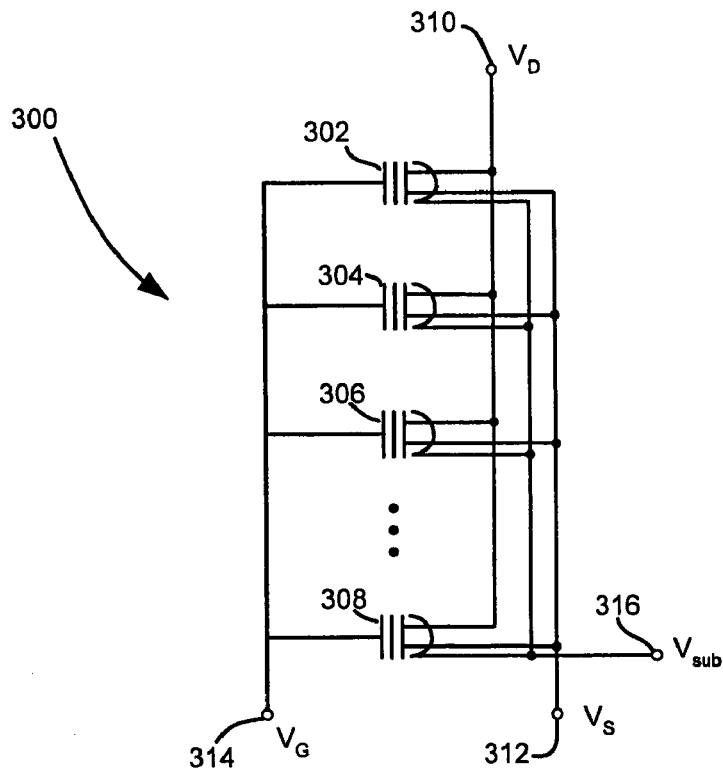
FIG. 3 is a is a simplified electrical schematic diagram of a column of flash EEPROM cells undergoing an erase operation.

FIG. 3 is a simplified electrical schematic diagram of a column 300 of flash EEPROM cells 302, 304, 306 and 308 showing erase voltages applied to the cell terminals in accordance with one implementation of the present invention. A bit line voltage $V_D$ may be applied to a common drain terminal 310, a source voltage $V_S$ may be applied to a common source terminal 312. A control gate voltage $V_G$ may also be applied to word line terminal 314 of each cell in column 300. A voltage $V_{sub}$ may also be applied to a common substrate terminal 316. Although in the erase operation each control gate in cells 302, 304, 306 and 308 may be connected to a common word line terminal, it should be understood that alternate operations, such as read and program, result in the application of individual voltages to word lines of particular cells.

In accordance with one implementation consistent with principles of the invention, cells 302, 304, 306 and 308 may be erased by applying a negative voltage $V_G$ to control gate terminal 314, a positive voltage $V_D$ to drain terminal 310 (or source terminal 312) while keeping the substrate terminal 316 grounded and source terminal 312 (or drain terminal 310) float. The applied voltages $V_D$ and $V_G$ generate hot holes through band-to-band tunneling of the drain/source junction. The electrical field pulls the generated hot holes into the charge storage layer and causes the electrons previously injected into the charge storage layer during programming being neutralized, thus reducing the threshold voltages of cells 302, 304, 306 and 308. Additional details regarding the erase process will be set forth in additional detail below.

Figure 4:
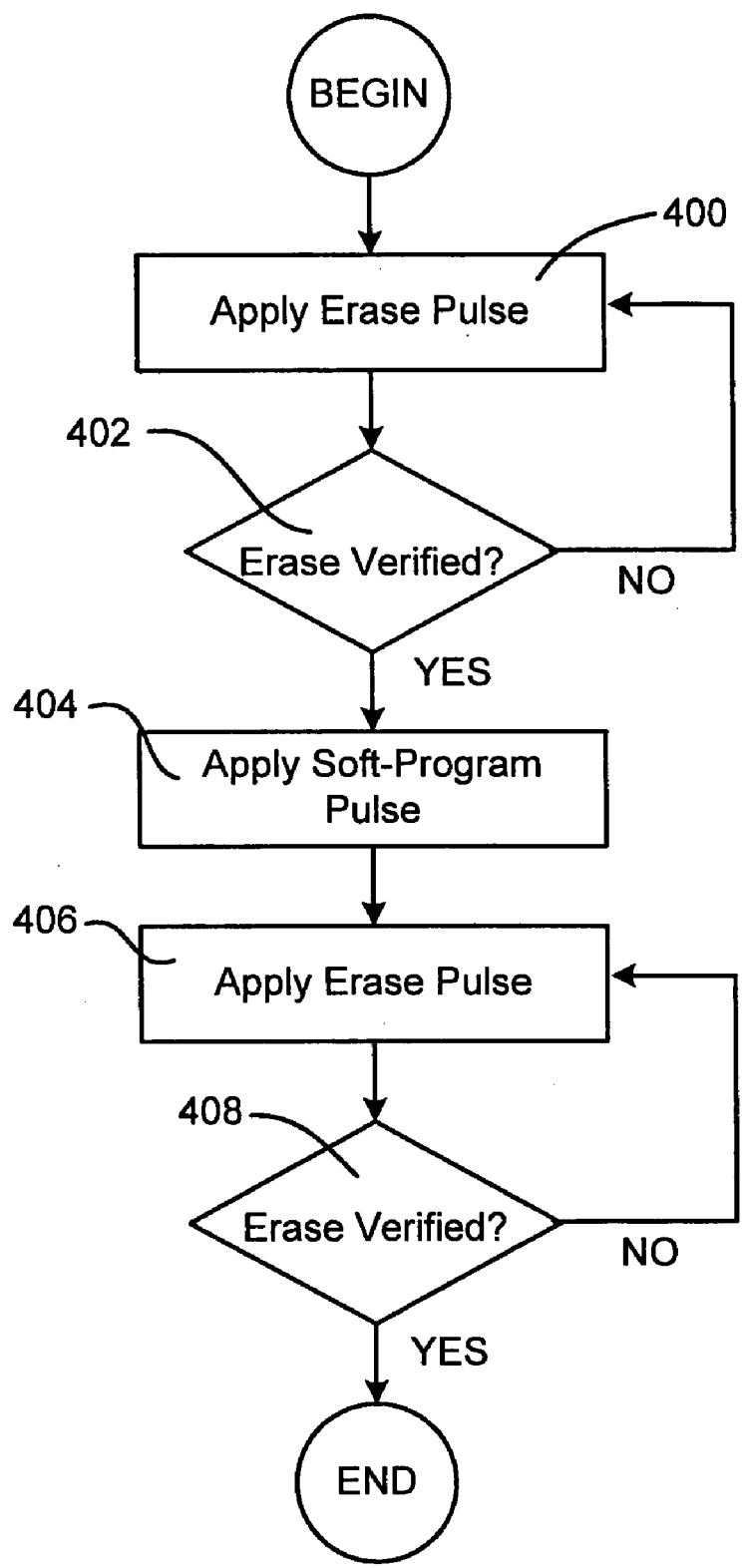
FIG. 4 is a is a flow diagram illustrating one implementation of a method for erasing memory cells in accordance with principles of the invention.

FIG. 4 is a flow diagram illustrating one implementation of a method for erasing memory cells in accordance with principles of the invention. Initially, an erase pulse is applied to the cells (act 400) to lower the threshold voltage for each cell in the column or array below a first predetermined maximum ($V_{TMAX-1}$). Reduction of the threshold voltage effectively removes the memory cells from a programmed state, thereby enabling the cell to be subsequently programmed. In one implementation consistent with principles of the invention, the erase pulse may consist of an application of a high voltage (e.g., 5.5 volts) applied as a pulse to the drain (or source) terminal of each cell and a negative word line voltage (e.g., −6.0 volts) to the control gate terminal of each cell, each bit line pulse having a predetermined pulse width and voltage. For example, the pulse width or duration of the pulses may range from about 10 µs to about 10 ms. The source (or drain) terminal is kept floating while the substrate terminal is grounded.

Following application of the erase pulse, an erase verification is performed (act 402) to determine if the threshold values for all cells being erased have been reduced below the desired level. If not, the process returns to act 400 where an additional erase pulse may be applied. The initial erase process continues in this manner until the threshold voltages for each cell being erased has been reduced to below $V_{TMAX-1}$.

Following erase verification, over-erase correction may be performed by applying a soft-programming pulse to the memory cells being erased (act 404). The soft-programming pulse raises the threshold voltage for at least those memory cells having a threshold voltage below a predetermined level (e.g., 0 volts). As discussed above, floating gates or charge storage layers in over-erased cells may be depleted of electrons and may become positively charged. The over-erased cells may then effectively function as depletion mode transistors that cannot be turned off by applying normal operating voltages to their control gates. Cells functioning as depletion mode transistors may also introduce leakage currents during subsequent program and read operations. By correcting for such over-erase conditions, leakage current may be reduced. In one implementation consistent with principles of the invention, the soft-programming pulse may consist of grounding the source terminal, applying a voltage of about 5.0 volts to the control gate terminal, applying a voltage of about 4.0 volts to the drain (or source) terminal, and grounding the substrate terminal of each cell to be soft-programmed. Further, the soft-programming pulses may be applied for a duration ranging from about 0.1 µs to about 10 µs.

Figure 5A:
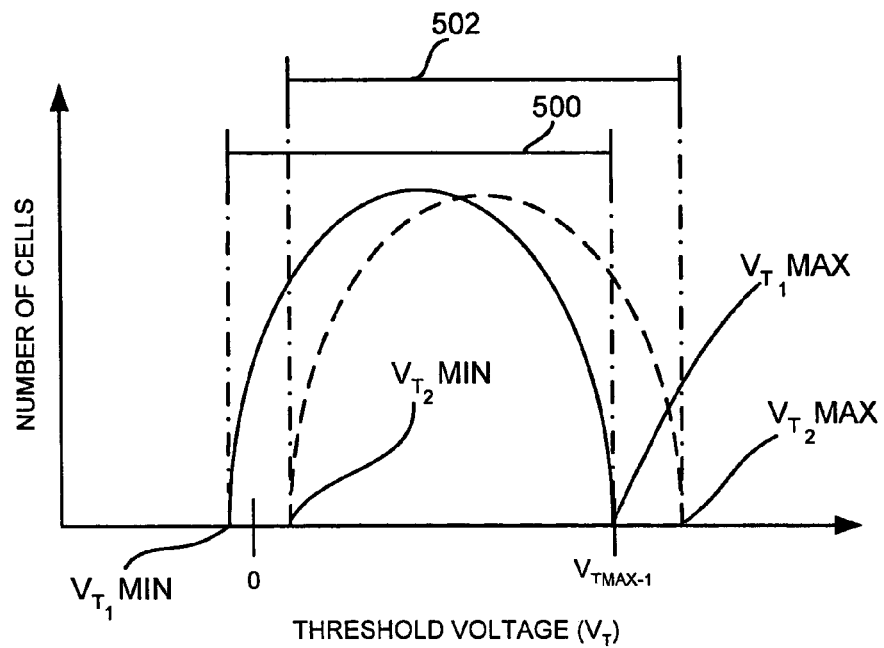
FIGS. 5A–5B are graphs illustrating threshold voltage distribution during the erase process of FIG. 4.

FIG. 5A is a graph illustrating threshold voltage distributions in the memory device following: 1) application of the initial erase pulse (500); and 2) application of the soft-programming pulse (502). As illustrated, following application of the initial erase pulse, threshold voltage distribution 500 is equal to its maximum threshold voltage ($V_{T1}MAX$) minus its minimum threshold ($V_{T1}MIN$). Upon application of the soft-programming pulse, threshold voltage distribution 502 is equal to its maximum threshold voltage ($V_{T2}MAX$) minus its minimum threshold ($V_{T2}MIN$). As shown, although the minimum threshold voltage $V_{T2}MIN$ has been raised relative to $V_{T1}MIN$ by the soft-programming pulse, the resulting threshold voltage distribution 502 is substantially similar to threshold voltage distribution 500. That is, the total width of voltage distribution 502 is substantially similar to the width of voltage distribution 500. It is desirable to reduce the width of the threshold voltage distribution prior to subsequent programming of the device. Further, a narrowly controlled threshold voltage distribution may provide a larger margin during device operation, thereby providing enhanced reliability, faster write/read speeds, and a longer device lifetime.

Following soft-programming of the memory cells being erased, it has been found that application of one or more additional erase pulses to the cells (act 406) narrows the threshold voltage distribution by reducing the maximum threshold voltage more significantly than the minimum threshold voltage distribution. In an exemplary implementation, an erase pulse may be applied consisting of an application of a voltage of about 4.0 volts to about 5.5 volts to the drain (or source) terminal and a voltage of about 0 volts to about −6.0 volts to the control gate terminal of each cell being erased for a duration ranging from about 10 µs to about 1 ms. Following application of the erase pulse in act 406, an additional erase pulse verification may be performed (act 408) to ensure that each cell's threshold voltage falls beneath a second predetermined maximum ($V_{TMAX-2}$). If not, another erase pulse may be applied, followed, if necessary, by additional erase pulses.

Figure 5B:
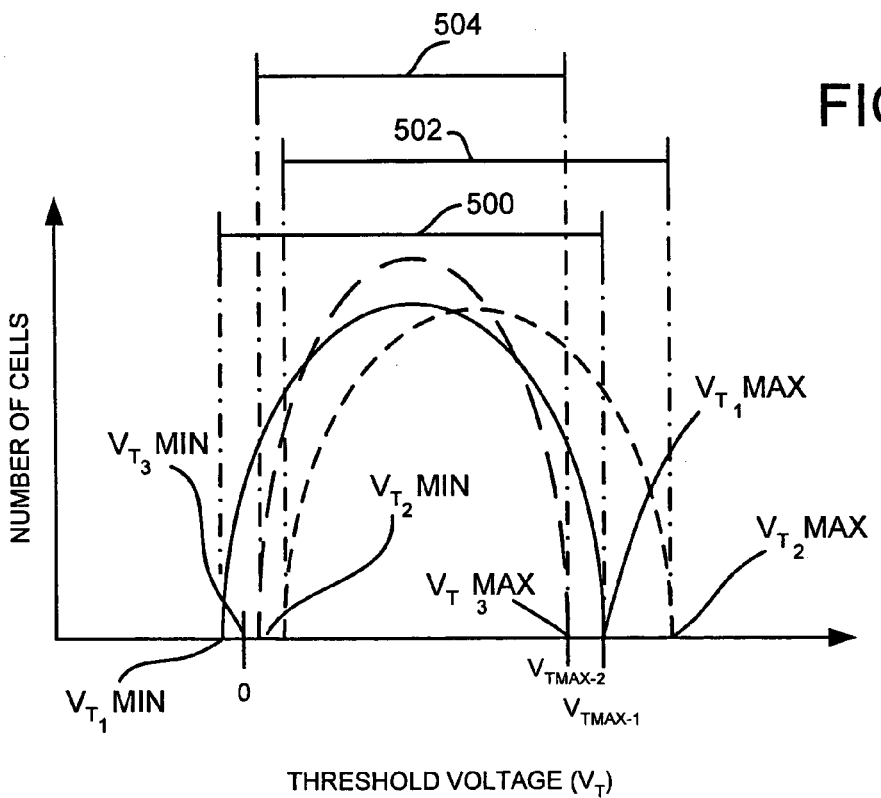

FIG. 5B is a graph illustrating threshold voltage distributions in the memory device following: 1) application of the initial erase pulse (500); 2) application of the soft-programming pulse (502); and 3) application of at least one addition erase pulse (504). As illustrated, following application of the initial erase pulse, threshold voltage distribution 500 is equal to its maximum threshold voltage ($V_{T1}MAX$) minus its minimum threshold ($V_{T1}MIN$). Upon application of the soft-programming pulse, threshold voltage distribution 502 is equal to its maximum threshold voltage ($V_{T2}MAX$) minus its minimum threshold ($V_{T2}MIN$). Following application of one or more additional erase pulses, threshold voltage distribution 504 is equal to its maximum threshold voltage ($V_{T3}MAX$) minus its minimum threshold voltage ($V_{T3}MIN$). As a result of the additional erase pulse application, threshold voltage distribution 504 is significantly narrower than both threshold voltage distribution 502 and threshold voltage distribution 500, thereby improving memory device performance.

Implementations, consistent with principles of the invention allow for reduced threshold voltage distributions by providing additional erase pulse application following soft-programming of memory cells. Such narrowly controlled threshold voltage distributions provide a larger margin during device operation, resulting in improved device reliability, faster write/read speeds, and longer device lifetime.

The foregoing is by way of example only and is not intended to be limiting. For example, the present invention may be practiced with any array of memory cells such as any non-volatile memory array. In addition, any specified material, any specified dimensions, and any specified voltage levels described herein are by way of example only. Other materials, dimensions, and voltage levels may be used for practicing the present invention, as would be apparent to one of ordinary skill in the art of non-volatile flash memory devices from the description herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed is:

1. A method for erasing a memory device including a number of memory cells, the memory cells including a substrate, a control gate, a charge storage element, a source region and a drain region, comprising:
    erasing a group of memory cells to lower a maximum threshold voltage of the group of memory cells below a first predetermined level;
    soft-programming the group of memory cells to raise a minimum threshold voltage of the group of memory cells above a second predetermined level; and
    erasing the group of memory cells, following soft-programming, resulting in a reduced threshold voltage distribution associated with the first group of memory cells.

2. The method of claim 1, wherein erasing the group of memory cells to lower a maximum threshold voltage of the group of memory cells below a first predetermined level, comprises:
    applying a first voltage to the drain of each memory cell;
    applying a second voltage to the control gate of each memory cell; and
    floating the source region of each memory cell, such that no voltage is applied thereto; and
    grounding the substrate.

3. The method of claim 2, wherein the first voltage ranges from about 4.0 volts to about 6.0 volts.

4. The method of claim 2, wherein the second voltage ranges from about −5.0 volts to about −7.0 volts.

5. The method of claim 1, wherein soft-programming the group of memory cells, comprises:
    grounding the source region;
    applying a first voltage to the drain;
    applying a second voltage to the control gate; and
    grounding the substrate region, such that no voltage is applied thereto.

6. The method of claim 5, wherein the first voltage is approximately 3.0–5.0 volts.

7. The method of claim 5, wherein the second voltage is approximately 4.0–6.0 volts.

8. The method of claim 1, wherein the first predetermined level is less than EV+0.5 volts, where EV denotes the erase target voltage.

9. The method of claim 1, wherein the second predetermined level is at least EV−0.5 volts, where EV denotes the erase target voltage.

10. The method of claim 1, wherein the reduced threshold voltage distribution is less than 1.0 volts.

11. The method of claim 1, wherein the reduced threshold voltage distribution defines a range between a maximum threshold voltage of EV+0.5 volts and a minimum threshold voltage of EV−0.5 volts, where EV denotes the erase target voltage.

12. The method of claim 1, comprising:
    verifying whether the maximum threshold voltage of the group of memory cells is below the first predetermined level; and
    re-erasing the group of memory cells if it is determined that the maximum threshold voltage of the group of memory cells is not below the first predetermined level.

13. The method of claim 1, wherein erasing the group of memory cells includes applying an erase pulse to the group of memory cells, the erase pulse having an applied drain voltage ranging from about 4.0 volts to about 5.5 volts, control gate voltage ranging from about 0 to about −6.0 volts, and a pulse width having a duration ranging from about 10 µs to about 1 ms.

14. The method of claim 1, wherein soft-programming the group of memory cells includes applying a pulse to the group of memory cells.

15. A memory device including an array of memory cells, the memory cells each having a substrate, a control gate, a charge storage layer, a source region, and a drain region, comprising:
    means for applying an erase pulse to at least some of the memory cells to lower a maximum threshold voltage of the at least some of the memory cells below a first predetermined level;
    means for applying a soft-program pulse to the at least some of the memory cells to raise a minimum threshold voltage of the at least some of the memory cells above a second predetermined level; and
    means for applying at least one additional erase pulse to the at least some of the memory cells, following application of the soft-program pulse, to generate a reduced threshold voltage distribution, associated with the at least some of the memory cells.

16. The memory device of claim 15, wherein the reduced threshold voltage distribution is smaller than a threshold voltage distribution following application of the soft-program pulse.

17. The memory device of claim 15, wherein the means for applying at least one additional erase pulse to the at least some of the memory cells, following application of the soft-program pulse, further comprises:
    means for applying a first voltage of between 4.0–5.5 volts to the drain of each memory cell; and
    means for applying a second voltage of 0 to −6 volts to the control gate of each memory cell.

18. A method for reducing a threshold voltage distribution in a memory device having an array of memory cells, each memory cell including a substrate, a control gate, a charge storage layer, a source region, and a drain region, comprising:
    applying at least one erase pulse to a number of memory cells in the array of memory cells;
    applying at least one soft-program pulse to the number of memory cells; and
    applying at least one additional erase pulse to the number of memory cells, wherein the additional erase pulse results in a reduced threshold voltage distribution associated with the number of memory cells substantially narrower than the threshold voltage distribution associated with the number of memory cells following application of the soft-program pulse.

19. The method of claim 18, wherein the applying at least one erase pulse to a number of memory cells in the array of memory cells, comprises:

applying at least one erase pulse to a number of memory cells in the array of memory cells to reduce a threshold voltage for each of the number of memory cells below a first predetermined voltage.

20. The method of claim 18, wherein the reduced threshold voltage distribution is not larger than 0.8 volts.

\* \* \* \* \*

UNITED STATES PATENT AND TRADEMARK OFFICE
CERTIFICATE OF CORRECTION

PATENT NO.       : 7,170,796 B1                                   Page 1 of 1
APPLICATION NO.  : 11/193391
DATED            : January 30, 2007
INVENTOR(S)      : Yi He et al.

It is certified that error appears in the above-identified patent and that said Letters Patent is hereby corrected as shown below:

At column 7, line 38, claim 1, "first" should be removed

Signed and Sealed this

Tenth Day of April, 2007

JON W. DUDAS
*Director of the United States Patent and Trademark Office*